US008450221B2

(12) United States Patent
Kirkpatrick et al.

(10) Patent No.: US 8,450,221 B2
(45) Date of Patent: May 28, 2013

(54) METHOD OF FORMING MOS TRANSISTORS INCLUDING SION GATE DIELECTRIC WITH ENHANCED NITROGEN CONCENTRATION AT ITS SIDEWALLS

(75) Inventors: Brian K. Kirkpatrick, Allen, TX (US); James Joseph Chambers, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 95 days.

(21) Appl. No.: 12/850,097

(22) Filed: Aug. 4, 2010

(65) Prior Publication Data

US 2012/0032280 A1    Feb. 9, 2012

(51) Int. Cl.
*H01L 21/00*    (2006.01)

(52) U.S. Cl.
USPC ........................................... 438/786

(58) Field of Classification Search
CPC .............. H01L 29/518; H01L 21/28202; H01L 21/28185; H01L 21/02126
USPC ................. 438/287, 769, 778, 786
See application file for complete search history.

(56) References Cited

U.S. PATENT DOCUMENTS

| 5,474,949 | A | * | 12/1995 | Hirao et al. | 438/398 |
| 6,211,045 | B1 | * | 4/2001 | Liang et al. | 438/585 |
| 6,548,366 | B2 | | 4/2003 | Niimi et al. | |
| 6,821,873 | B2 | | 11/2004 | Visokay et al. | |
| 7,144,825 | B2 | | 12/2006 | Adetutu et al. | |
| 2003/0170956 | A1 | * | 9/2003 | Zhong et al. | 438/287 |
| 2003/0181027 | A1 | * | 9/2003 | Liang et al. | 438/584 |
| 2004/0248392 | A1 | * | 12/2004 | Narwankar et al. | 438/584 |
| 2008/0032510 | A1 | | 2/2008 | Olsen | |
| 2009/0088002 | A1 | | 4/2009 | Liu et al. | |

OTHER PUBLICATIONS

Iwamori et al., Characterization of silicon oxynitride gas barrier films, 2003, Vacuum, vol. 68, pp. 113-117.*
Quirk et al., "Semiconductor manufacturing technology", 2001, Peason, pp. 225, 264, 265.*

* cited by examiner

*Primary Examiner* — Nikolay Yushin
(74) *Attorney, Agent, or Firm* — Jacqueline J. Garner; Wade J. Brady, III; Frederick J. Telecky, Jr.

(57) ABSTRACT

A method of forming an integrated circuit (IC) having at least one MOS device includes forming a SiON gate dielectric layer on a silicon surface. A gate electrode layer is deposited on the SiON gate layer and then patterning forms a gate stack. Exposed gate dielectric sidewalls are revealed by the patterning. A supplemental silicon oxide layer is formed on the exposed SiON sidewalls followed by nitriding. After nitriding, a post nitridation annealing (PNA) forms an annealed N-enhanced SiON gate dielectric layer including N-enhanced SiON sidewalls, wherein along lines of constant thickness a N concentration at the N-enhanced SiON sidewalls is ≧ the N concentration in a bulk of the annealed N-enhanced SiON gate layer −2 atomic %. A source and drain region on opposing sides of the gate stack are formed to define a channel region under the gate stack.

11 Claims, 4 Drawing Sheets

METHOD OF FORMING MOS TRANSISTORS INCLUDING SiON GATE DIELECTRIC WITH ENHANCED NITROGEN CONCENTRATION AT ITS SIDEWALLS

FIELD

Disclosed embodiments relate to integrated circuits (ICs) including MOS transistors having SiON gate dielectrics.

BACKGROUND

Replacing conventional silicon oxide (e.g. $SiO_2$) gate dielectrics with silicon oxynitride (SiON) layers for MOS transistors is known to reduce gate dielectric leakage and boron (B) penetration from the gate electrode (for $P^+$ polysilicon gate for PMOS) into the underlying semiconductor surface which can result in threshold voltage (Vt) shifts. A conventional method to form a SiON gate dielectric layer includes thermal oxidation of a silicon comprising surface to form a silicon oxide "base" dielectric, followed by a plasma nitridation to incorporate nitrogen (N) throughout the silicon oxide dielectric, and then a thermal post nitridation anneal in $O_2/N_2$ at a temperature around 1,100° C.

The higher the N concentration in the SiON dielectric, the higher its dielectric constant which allows the use of a thicker dielectric film for a given equivalent oxide thickness (EOT). The thickness of the SiON layer may be expressed as an EOT which is a parameter used to compare the performance of MOS transistors having a high-k dielectric layer with the performance of MOS transistors having a silicon dioxide gate dielectric layer. The EOT is defined as the thickness of a silicon dioxide gate dielectric needed to obtain the same gate capacitance as that obtained with a gate dielectric having a higher dielectric constant k as compared to silicon dioxide (the k of $SiO_2$ is about 3.9). For example, an EOT of 1 nm would result from the use a 10 nm thick high-k dielectric that has a k value of 39.

With ever increasing N concentrations within the gate dielectric, the process has become susceptible to reduced Gate Oxide Integrity (GOI) and/or increased Early Failure Rates (EFR), notable along gate dielectric edges. Within the wafer fab engineering community, this is referred to as elevated polysilicon finger failures when similarly sized (area) polysilicon block structures fail at a reduced rate compared to polysilicon fingers which are structures with a higher ratio of polysilicon edge area per total unit area. Most work to address this problem has been directed at improving the silicon oxide base dielectric quality, or reducing the gate etch depletion effect (e.g., by changing the etch conditions).

SUMMARY

Disclosed embodiments are based on the Inventors' recognition that conventional gate-first process flows inherently expose the sidewalls of the SiON gate dielectric once the gate (e.g., polysilicon) etch has been performed, and the exposure leads to significant N loss at the sidewalls as a function of exposure time. Further, the Inventors have recognized that promptly capping the exposed SiON sidewalls with a capping layer is not practical since such a capping layer cannot be put in place until after the wafer surface is cleaned following gate etch, thus being too late to avoid significant N loss along the SiON sidewalls.

Disclosed embodiments do not require minimizing the N loss along the exposed SiON sidewalls following gate etch. Instead, disclosed embodiments comprise processing that adds N by a supplemental oxidation and nitridation to replace (and in some embodiments provide enough N to more than replace) the N lost at the exposed SiON sidewall following gate etch. In a typical embodiment, a supplemental silicon oxide layer is formed on the exposed SiON sidewalls, and the supplemental silicon oxide layer is then nitrided.

The supplemental silicon oxide layer can formed by a solution-based chemical oxidation, such as provided by a post gate etch clean, or by deposition or thermal growth that can follow the post gate etch clean. The nitridation of the supplemental silicon oxide layer can comprise a plasma nitridation process such as Decoupled-plasma nitridation (DPN). A post nitridation anneal (PNA) follows the nitridation to form an annealed N-enhanced SiON gate dielectric layer including N-enhanced SiON sidewalls. The PNA can include oxygen and include conditions that form up to 20 Å of additional SiON. The PNA can stabilize the N added and repair defects induced in the SiON gate layer along the SiON sidewalls that can result from the plasma nitridation.

DETAILED DESCRIPTION

Figure 1:
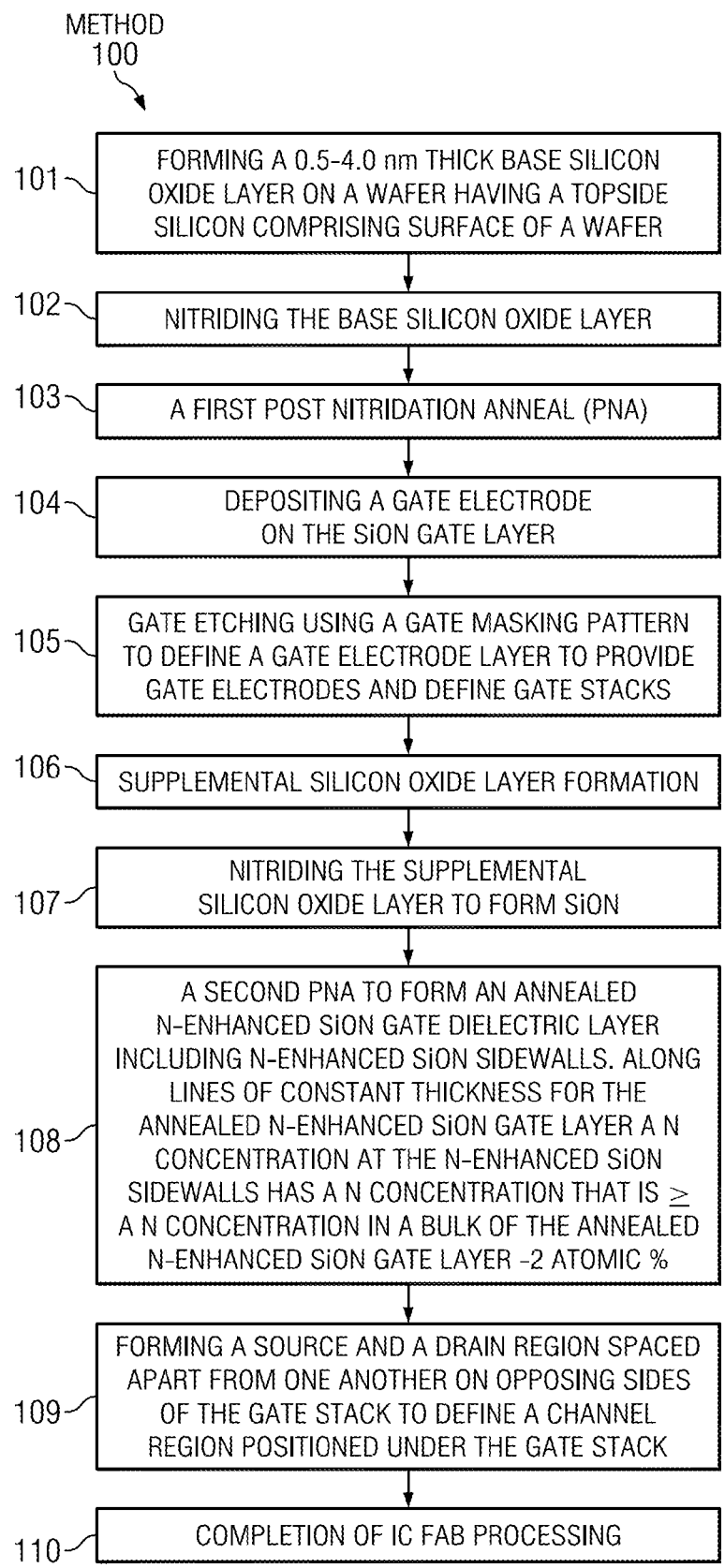
FIG. 1 is a flow chart that shows steps in an exemplary method for forming an IC comprising MOS transistors including a N-enhanced SiON gate dielectric having N-enhanced SiON sidewalls, according to an embodiment of the invention.

Disclosed embodiments are described with reference to the attached figures, wherein like reference numerals are used throughout the figures to designate similar or equivalent elements. The figures are not drawn to scale and they are provided merely to illustrate the disclosed embodiments. Several aspects are described below with reference to example applications for illustration. It should be understood that numerous specific details, relationships, and methods are set forth to provide a full understanding of the disclosed embodiments. One having ordinary skill in the relevant art, however, will readily recognize that the disclosed embodiments can be practiced without one or more of the specific details or with other methods. In other instances, well-known structures or operations are not shown in detail to avoid obscuring the disclosed embodiments. The disclosed embodiments are not limited by the illustrated ordering of acts or events, as some acts may occur in different orders and/or concurrently with other acts or events. Furthermore, not all illustrated acts or events are required to implement a methodology in accordance with disclosed embodiments.

Notwithstanding that the numerical ranges and parameters setting forth the broad scope of this Disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

FIG. 1 is a flow chart that shows steps in an exemplary method 100 for forming an IC comprising MOS transistors including a N-enhanced SiON gate dielectric having N-enhanced SiON sidewalls, according to an embodiment of the invention. Step 101 comprises forming a 0.5-4.0 nm thick base silicon oxide layer, such as by thermally or chemically oxidizing an exposed topside silicon surface of a wafer. When the steps 106-108 are configured to form as much as 10 to 20 Å of SiON, the base silicon oxide layer formed during step 101 is generally 5 to 15 Å thick, typically from 6 to 10 Å thick.

As used herein and unless otherwise specified, the term "silicon" refers to all forms of silicon, including but not limited to, single crystalline, polycrystalline and amorphous silicon, and certain compounds (alloys) of silicon, including but not limited to, silicon germanium (SiGe) and silicon carbide (SiC). In one embodiment the thickness of the silicon oxide layer is 1.0 to 3.0 nm. For example, the base silicon oxide layer can be grown by oxidation in ambients such as $O_2$, $O_2+H_2$, $N_2O$, $N_2O+H_2$, $H_2O$, in a temperature range of 800-1100° C., at a pressure of 0.001-100 Torr, for a time of 1-60 s. Reduced pressure (i.e. sub-atmospheric pressure) oxidation reduces the oxidation rate to limit the thickness of the resulting base silicon oxide layer.

Step 102 comprises nitriding the base silicon oxide layer to form SiON. Those skilled in the art will appreciate that different plasma methods can be used for introducing N into a silicon oxide layer. For example, plasma-enhanced-chemical-vapor-deposition (PECVD) methods can be used in which substrates are subjected to a plasma atmosphere in a conventional CVD apparatus. For example, nitridation can be performed in $NH_3$ or $NH_3$ containing ambient at a temperature of 500-1000° C., at a pressure of 0.001-100 Torr, for a time of 1 to 60 s. Further, parallel plate plasma deposition systems can also be used to introduce N into a dielectric material. A DPN may also be used. DPN uses inductive coupling for plasma formation. In DPN, radio frequency (RF) power is transferred to the plasma via an RF magnetic field, which, in turn, generates an ionizing electric field. The plasma environment can comprise $N_2$, $N_2+He$, $N_2+$noble gas or $NH_3$.

As used herein, "SiON" refers to a dielectric material comprising Si, O and N that comprises a N concentration of 6 to 35 at. % SiON for layers having uniform N concentration along their thickness dimension and a maximum N concentration of 8 to 35 at. % N for SiON layers having non-uniform N concentration along their thickness dimension. The Si concentration can range from 34 to 40 at. %, and the O concentration can range from 26 to 60 at. %.

In one embodiment the nitridation performed in step 102 is used to set the basic shape of the N concentration profile over its thickness, such that the maximum N concentration in the SiON gate layer away from the silicon interface is sufficiently high, for example at least 10 at. %. A sufficiently high N concentration away from the silicon interface in the SiON layer provides leakage current (Jg) reduction and B blocking (for B doped polysilicon gates), while being shallow enough to prevent nitridation of the silicon interface and resulting mobility/delta Vt degradation.

Step 103 comprises a first PNA. The first PNA can comprise a multi-step PNA. The multi-step PNA can comprise a first anneal 103(a) in a non-oxidizing ambient that can remove weakly bonded N and stabilize the remaining N in the SiON gate layer such that it is less likely to diffuse out during subsequent thermal processing. In one embodiment the first anneal 103(a) is performed in a $N_2$ or a noble gas ambient at a temperature from 500-1100° C., at a pressure of 0.001 to 760 Torr, for a time of 0.1 to 60 s.

For the multi-step PNA, the first anneal 103(a) is followed by a second anneal 103(b) in an oxidizing ambient. The second (oxidizing) anneal 103(b) can heal remaining defects in the SiON gate layer without subjecting the SiON gate layer at the silicon interface to additional oxidation in order to prevent degradation of the EOT of the SiON gate layer. The second anneal 103(b) can also reduce the N concentration at the top portion of the SiON gate layer (near the gate electrode interface) which the Inventors have discovered can be helpful for polysilicon gates in order to reduce the N-content in order to avoid an increase in polysilicon depletion that can result from BN formation for $P^+$ polysilicon gates. The second anneal 103(b) generally grows 1 or 2 Å of SiON. In one embodiment the second anneal 103(b) is performed in an oxygen containing gas including pure $O_2$ gas at 500 to 1100° C., at a pressure of 0.001 to 100 Torr, for a time of 0.1 to 120 s. In another embodiment, the first anneal 103(a) and the second anneal 103(b) of the PNA are performed in a common chamber (e.g. single wafer rapid thermal annealer (RTA)).

Step 104 comprises depositing a gate electrode layer on the SiON gate layer. In one embodiment, the gate electrode layer can comprise polysilicon. Polysilicon can be deposited using a silicon comprising gas, such as $SiH_4$, $Si_2H_6$, $Si_2Cl_6$ or $SiH_2Cl_2$, etc., at a temperature of 500-800° C., at a pressure of 1 to 100 Torr, for a time from 10 to 300 s. In other embodiments, the gate electrode layer can comprise a metal to provide a metal gate, such as W/TiN, Mo, Ta, TaN, TiN or $TaSi_xN_y$ in the case of a replacement gate process.

In one embodiment, reduced pressure is maintained between step 102 and step 104 at a level below 300 Torr, such as a level below 100 Torr. The Inventors have found that performing such steps in reduced pressure prevents uncontrolled N-loss due to reaction of the SiON gate layer with ambient oxygen and also prevents the SiON layer from being contaminated from adventitious carbon both of which can degrade device performance for MOS devices in terms of EOT and Vt control. Maintaining reduced pressure allows the SiON gate layer to be essentially carbon free (e.g. <0.2 atomic % C). For example, in one embodiment, forming the silicon oxide layer (step 101) takes place in a first chamber, the wafer is transferred under reduced pressure to a second chamber, wherein the nitriding (step 102) takes place in the second chamber. The wafer is transferred under reduced pressure to a third chamber, wherein the first anneal 103(a) takes place. The wafer is transferred under reduced pressure to a fourth chamber, wherein the second anneal 103(b) takes place. The wafer is transferred at step 104 under reduced pressure to a fifth chamber, wherein the gate electrode layer is deposited.

Step 105 comprises a gate etch using a gate masking pattern to define the gate electrode layer to provide gate electrodes and thus define gate stacks, and optionally gate electrode lines and other gate electrode layer features (e.g., capacitor plates). An optional hard-mask layer (e.g., silicon nitride with a SiON cap) can be added between step 104 and 105. The finite gate electrode layer to SiON gate layer selectivity during gate etch combined with the nominal overetch during the gate etch at step 105 results in the formation of exposed SiON sidewalls which the Inventors have recognized leads to N loss while the SiON sidewall is exposed to the ambient.

Step 106 comprises supplemental silicon oxide formation. In one embodiment forming the supplemental silicon oxide layer comprises a solution-based chemical oxidation which can oxidize the exposed gate electrode sidewall when the gate electrode comprises polysilicon including along at its interface with the SiON sidewall which can increase the thickness of the gate dielectric layer several Å along its exposed sidewall. The silicon oxide formed by the solution-based chemical oxidation is typically a low density and is typically 6 to 12 Å thick, that upon annealing would condense in a non-oxidizing ambient down to <2 Å. In the particular case of a solution-based chemical oxidation, the wet chemistry can comprise use of solutions such as SC1 (i.e., $NH_4OH$, $H_2O_2$, and DIW mixture). Typical SC1 conditions comprising $NH_4OH:H_2O_2:DIW$ 1:1:5 to 1:2:100, such as at 1:1:20 to 1:1:50, at a T of 25 to 70° C., for 1 to 10 minutes. Alternatively, sulfuric acid/hydrogen peroxide ($H_2SO_4$, $H_2O_2$) can be used; typically in a 2:1 to 20:1 ratio, in a temperature range of 85 to 180° C., for 1 to 15 minutes may be used. In yet another embodiment, SC2 conditions comprising $HCl/H_2O_2/DIW$ at 1:1:5 to 1:2:500, 1 to 2 minutes, 25 to 80° C. may be used.

In another embodiment forming the supplemental silicon oxide layer comprises a deposition, such as LPCVD. In the case of a deposition, the supplemental oxide is deposited on top of the exposed SiON sidewall. In another embodiment the supplemental silicon oxide layer is grown by thermal oxidation, such as at a temperature of 800-1100° C., a pressure of 0.001-10 Torr, for a time of 1-60 s. Thermal oxidation can proceed from the topside silicon comprising surface as well as from the exposed gate electrode sidewall when the gate electrode comprises polysilicon. Like the solution-based chemical oxidation, thermal oxidation can increase the thickness of the SiON gate layer several Å along its exposed sidewall.

Step 107 comprises nitriding the supplemental oxide layer to form SiON. Step 107 can generally utilize any of the various plasma processes disclosed above relative to step 102, and in one embodiment comprises DPN.

Step 108 comprises a second PNA to form an annealed N-enhanced SiON gate dielectric layer including N-enhanced SiON sidewalls, wherein along lines of constant thickness for the annealed N-enhanced SiON gate layer a N concentration at the N-enhanced SiON sidewalls is $\geq$ the N concentration in a bulk (away from the sidewalls) of the annealed N-enhanced SiON gate layer −2 atomic %. The thickness of the annealed N-enhanced SiON gate layer following the second PNA is generally from 12 to 30 Å. Three (3) exemplary PNA variants are described below, and are referred to herein as type A, type B and type C PNAs.

A type "A" PNA can be based on the multi-step PNA described above relative to step 103, with the first anneal performed in a $N_2$ or a noble gas ambient at a temperature from 500 to 1100° C., at a pressure of 0.001-760 Torr, for a time of 0.1-60 s, and the second anneal performed in an oxygen containing gas including pure $O_2$ gas at 500 to 1100° C., at a pressure of 0.001 to 100 Torr, for a time of 0.1 to 120 s. The type A PNA typically grows 0.5 to 2.0 Å of SiON, but can grow as much as 6 to 8 Å.

The type "B" PNA comprises a time from 5 to 30 s, a temperature from 1,000 to 1,105° C., a pressure from 0.1 to 3.0 Torr, a rotation rate range from 120 to 360 RPM, in an oxidizing ambient comprising $O_2$ from 1.2 to 3.6 slm, $O_2/N_2$ from 1.2/3.6 to 3.6/1.2, or $O_2/N_2$ from 0.4/2.0 to 2.0/0.4. The type B PNA typically grows 7 to 9 Å of SiON, but can grow from 4 to 19 Å. In one particular embodiment the type B PNA comprises a time of 15 s, a temperature of 1100° C., a pressure of 0.48 Torr, a rotation rate of 240 RPM, and an oxidizing ambient comprising 2.4 slm $O_2$.

The type "C" PNA is generally is accompanied by Step 106 comprising the solution-based chemical oxidation embodiment, but can include other oxidations. The type C PNA comprises a time from 8 to 15 s, a temperature from 750 to 900° C., a pressure from 5 to 40 Torr, and an oxidizing ambient comprising $N_2O$ and $H_2$ with $N_2O$ from 5 to 10 slm, and $H_2$ from 0.1 to 0.5 slm. In one particular embodiment the type C PNA comprises 8 slm $N_2O/0.2$ slm $H_2$ The type C PNA typically grows 0.5-2.0 Å of SiON, but can grow from 6 to 8 Å.

Step 109 comprises forming a source and a drain region spaced apart from one another on opposing sides of the gate stack to define a channel region positioned under the gate stack, and step 110 comprises completion of IC fab processing. A spacer process as known in the art may be added between steps 108 and 109. Conventional processing can generally be used for steps 109 and 110.

Figure 2:
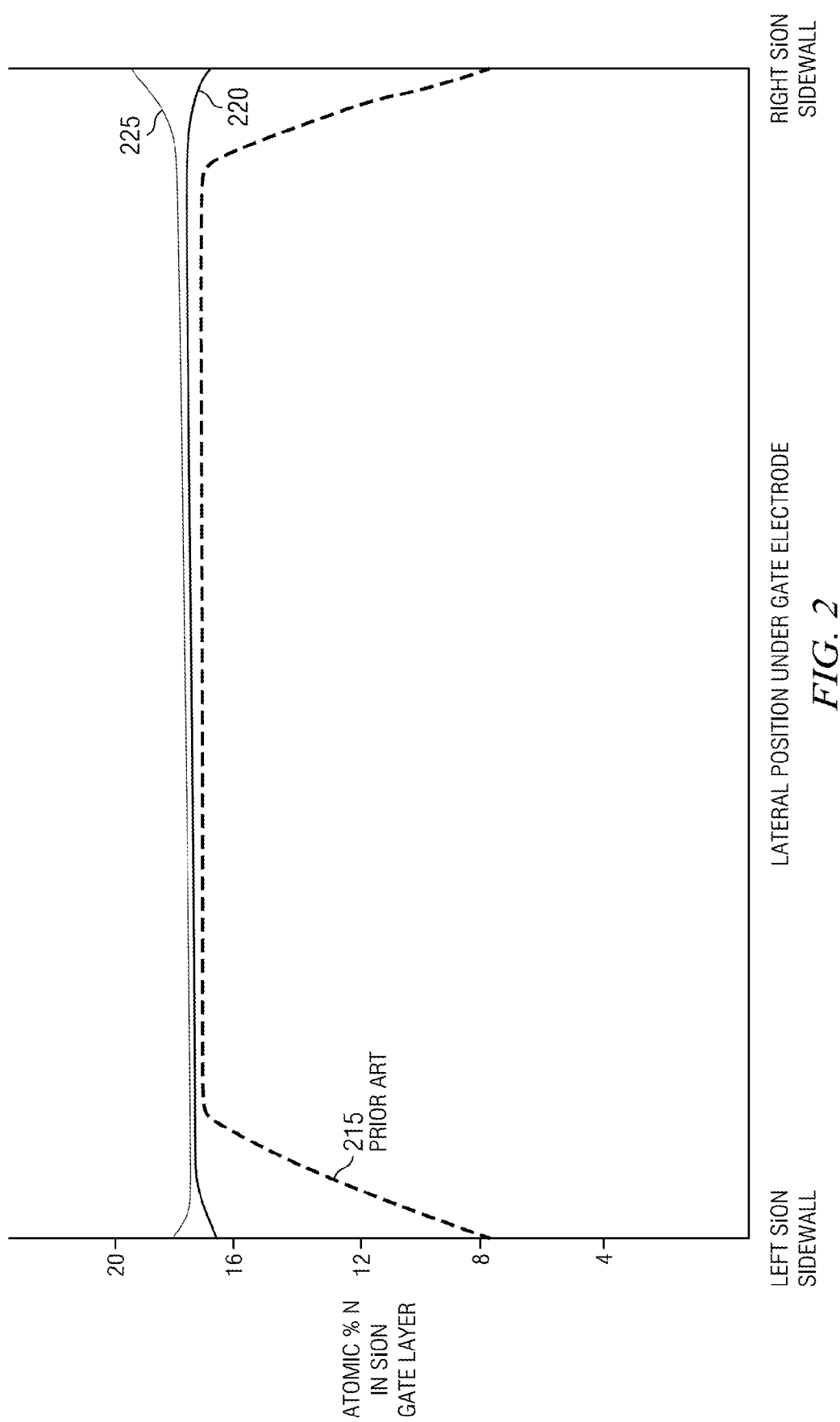
FIG. 2 is graphical representation of a N concentration profile as a function of lateral position from one sidewall to the other sidewall under the gate electrode along a line of constant thickness for exemplary N-enhanced SiON gate dielectric layers having N-enhanced SiON sidewalls according to disclosed embodiments as compared to a conventional "prior art" SiON gate dielectric layer having N-depleted SiON sidewalls.

FIG. 2 is graphical representation of a N concentration profile as a function of lateral position from one sidewall to the other sidewall under the gate electrode along a line of constant thickness (e.g., 6 Å from the gate electrode interface, along a lateral distance of 50 nm from one sidewall to the other sidewall) for an exemplary N-enhanced SiON gate dielectric layer having an N-enhanced SiON sidewalls as compared to a conventional "prior art" SiON gate dielectric layer having N-depleted SiON sidewalls. The "prior art" SiON gate dielectric layer 215 is shown having a 17 at. % N concentration in its bulk region defined herein to be away from the left and right SiON sidewalls, and a N concentration <8 at. % at both its left and right SiON sidewalls. As described above, SiON gate dielectric layer 215 has N depletion at its sidewalls compared to the N concentration in its bulk away from the sidewalls due to exposure of the sidewalls of the SiON gate dielectric to the ambient once the gate etch has been performed.

In contrast, N concentration profiles 220 and 225 represent N-enhanced SiON gate dielectric layers having N-enhanced SiON sidewalls that result from performing additional processing to "prior art" SiON gate dielectric layer 215 comprising step 106 (supplemental silicon oxide formation), step 107 (nitriding the supplemental silicon oxide to form SiON), and step 108 (a second PNA to form an annealed N-enhanced SiON gate dielectric layer including N-enhanced SiON sidewalls). Steps 106-108 provide N-enhanced SiON gate layers having a N concentration at the N-enhanced SiON sidewalls that is $\geq$ a N concentration in the bulk (away from the left and right SiON sidewalls) of the N-enhanced SiON gate layer −2 atomic %. For example, N concentration profile 220 is shown having a 17 at. % N concentration in its bulk away from the left and right SiON sidewalls, and a N concentration between 16 and 17 at. % at both its left and right SiON sidewalls. N concentration profile 225 is shown having a 17 at. % N concentration in its bulk away from the left and right SiON sidewalls, and a N concentration higher than that away from the left and right SiON sidewalls of about 18 at. % at both its left and right SiON sidewalls.

Figure 3:
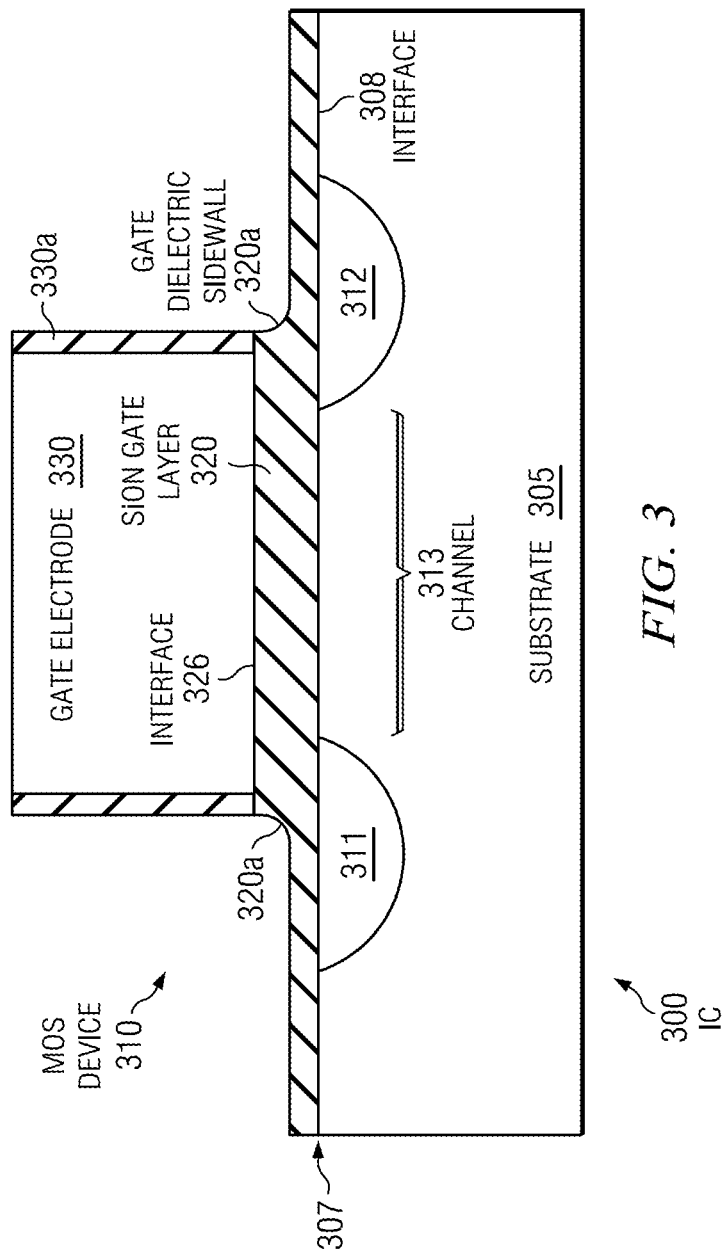
FIG. 3 is a simplified cross sectional view of a portion of an IC including a substrate having a topside silicon comprising surface shown including at least one MOS device that includes a N-enhanced SiON gate dielectric layer having an N-enhanced SiON sidewalls, according to a disclosed embodiment.

FIG. 3 is a simplified cross sectional view of a portion of an IC 300 including a substrate 305 having a topside silicon comprising surface 307 shown including at least one MOS device 310 that includes a N-enhanced SiON gate dielectric layer 320 having an enhanced N-enhanced SiON sidewalls 320(*a*), according to a disclosed embodiment. The topside silicon interface 308 shown in FIG. 3 represents the interface between the N-enhanced SiON gate layer 320 and the topside silicon comprising surface 307, while gate electrode interface 326 represents the interface between the N-enhanced SiON gate layer 320 and the gate electrode 330.

Gate electrode 330 is shown as a polysilicon electrode, and as such, is N-enhanced along its sidewall 330(*a*) ≧10 at. % due to the nitridation during the nitridation processes described above (steps 107 and 108). Along lines of constant thickness for the annealed N-enhanced SiON gate layer 320 a N concentration at the N-enhanced SiON sidewalls 320(*a*) is ≧ the N concentration in a bulk of the annealed N-enhanced SiON gate layer −2 atomic %, such as shown by representations 220 and 225 provided in FIG. 2.

As described above, substrate 305 can comprise any one of a bulk silicon substrate, SiGe substrate, strained silicon substrate, an SOI substrate, or other single crystal substrate. The MOS device 310 is shown in a highly simplified form and as shown includes a source region 311 and a drain region 312 spaced apart to define a channel region 313. Features such as LDDs, spacers and additional implants (e.g. halo implants) are not shown to avoid obscuring inventive details. In one embodiment, the gate electrode 330 comprises polysilicon, such as $P^+$ (e.g. B) doped for PMOS devices and N+ doped for NMOS devices. In other embodiments, the gate electrode 330 comprises a metal gate, such as when a replacement metal gate process is employed, so that the gate electrode 330 can comprise metal gates such as W/TiN, Mo, Ta, TaN, TiN or $TaSi_xN_y$.

Although not shown in FIG. 3, IC 300 generally includes other active circuitry, comprising circuit elements that generally include other transistors including bipolar transistors, diodes, capacitors, and resistors, as well as signal lines and other conductors that interconnect these various circuit elements.

Figure 4:
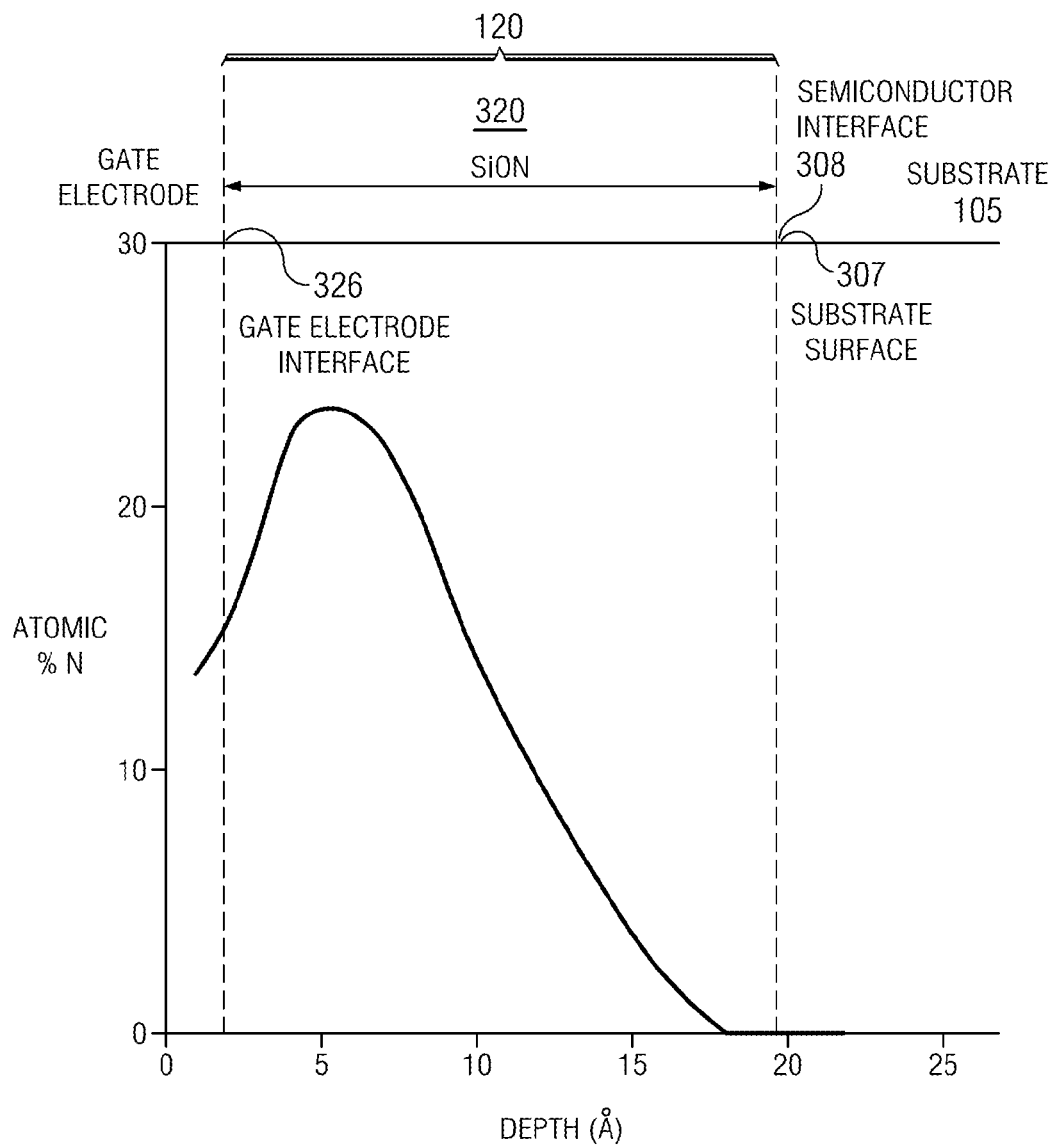
FIG. 4 is a graphical representation of a N concentration profile in the thickness dimension for a bulk region (away from the SiON sidewalls) of an exemplary SiON gate dielectric layer according to a disclosed embodiment.

FIG. 4 is a graphical representation of a N concentration profile in the thickness dimension for a bulk region (away from the SiON sidewalls) for an exemplary SiON gate dielectric layer according to a disclosed embodiment. For example, method 100 described above can provide the concentration profile shown in FIG. 4. The average N concentration can be seen to be ≧8 at. %, such as ≧10 at. %, a maximum N concentration of least 15 at. %, and a N concentration at an interface 308 between the N-enhanced SiON gate layer and the topside silicon comprising surface shown as the semiconductor interface to be ≦2 at. %.

Embodiments of the invention can be integrated into a variety of process flows to form a variety of devices and related products. The semiconductor substrates may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, embodiments of the invention can be used in a variety of processes including bipolar, CMOS, BiCMOS and MEMS.

While various embodiments of the invention have been described above, it should be understood that they have been presented by way of example only, and not limitation. Numerous changes to the disclosed embodiments can be made in accordance with the disclosure herein without departing from the spirit or scope of the disclosed embodiments. Thus, the breadth and scope of embodiments of the invention should not be limited by any of the above explicitly described embodiments. Rather, the scope of the invention should be defined in accordance with the following claims and their equivalents.

Although the embodiments of invention have been illustrated and described with respect to one or more implementations, equivalent alterations and modifications will occur to others skilled in the art upon the reading and understanding of this specification and the annexed drawings. In addition, while a particular feature may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting to embodiments of the invention. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

We claim:

1. A method of forming an integrated circuit (IC) including at least one MOS device on a wafer having a topside silicon comprising surface, comprising:

forming a SiON gate dielectric layer on said topside silicon comprising surface;

depositing a gate electrode layer on said SiON gate layer;

patterning said gate electrode layer to form a gate stack, wherein exposed SiON sidewalls and exposed gate electrode sidewalls are revealed by said patterning;

forming a supplemental silicon oxide layer on or along said exposed SiON sidewalls;

nitriding said supplemental silicon oxide layer;

after said nitriding, post nitridation annealing (PNA) to form an annealed N-enhanced SiON gate dielectric layer including N-enhanced SiON sidewalls, wherein along lines of constant thickness for said annealed N-enhanced SiON gate layer a N concentration at said N-enhanced SiON sidewalls is ≧ a N concentration in a bulk of said annealed N-enhanced SiON gate layer −2 atomic %, and forming a source and a drain region spaced apart from one another on opposing sides of said gate stack to define a channel region positioned under said gate stack.

2. The method of claim 1, wherein said forming said supplemental silicon oxide layer comprises a solution-based chemical oxidation.

3. The method of claim 1, wherein said forming said supplemental silicon oxide layer comprises depositing.

4. The method of claim 1, where said forming said supplemental silicon oxide layer comprises thermal oxidation at a temperature of 800-1100° C., a pressure of 0.001 to 10 Torr, for a time of 1 to 60 s.

5. The method of claim 1, wherein said PNA comprises a first anneal performed in a $N_2$ or a noble gas ambient at a temperature from 500 to 1100° C., at a pressure of 0.001 to 760 Torr, for a time of 0.1 to 60 s, and a second anneal performed in an oxygen containing gas including pure $O_2$ gas at 500 to 1100° C., at a pressure of 0.001 to 100 Torr, for a time of 0.1 to 120 s.

6. The method of claim 1, wherein said PNA comprises a time from 5 to 30 s, a temperature from 1,000 to 1,105° C., a pressure from 0.1 to 3.0 Torr in an oxidizing ambient comprising $O_2$ from 1.2 to 3.6 slm, $O_2/N_2$ from 1.2/3.6 to 3.6/1.2, or $O_2/N_2$ from 0.4/2.0 to 2.0/0.4.

7. The method of claim 1, wherein said forming said supplemental silicon oxide layer comprises a solution-based chemical oxidation and said PNA comprises a time from 8 to 15 s, a temperature from 750 to 900° C., a pressure from 5 to 40 Torr, and an oxidizing ambient comprising $N_2O$ and $H_2$ with $N_2O$ from 5 to 10 slm, and $H_2$ from 0.1 to 0.5 slm.

8. The method of claim 1, wherein said nitriding is performed in an $N_2$ plasma, $N_2$+He plasma, $N_2$+noble gas plasma or an $NH_3$-containing plasma.

9. The method of claim 1, wherein said nitriding comprises decoupled-plasma nitridation (DPN).

10. The method of claim 1, wherein said gate electrode layer comprises polysilicon that is deposited using a silicon comprising gas at a temperature of 500-800° C., a pressure of 1 to 100 Torr, for a time of 10 to 300 s.

11. The method of claim 1, wherein:

said forming said supplemental silicon oxide film takes place in a first chamber;

further comprising transferring said wafer under a pressure of 0.001 Torr to 100 Torr to a second chamber; wherein said nitriding takes place in said second chamber, and further comprising transferring said wafer under vacuum to a third chamber, wherein said PNA takes place in a third chamber.

* * * * *